(12) United States Patent
Wang (10) Patent No.: US 11,088,132 B2
(45) Date of Patent: Aug. 10, 2021

(54) SEMICONDUCTOR DEVICE FOR ENHANCING ELECTROSTATIC DISCHARGE PROTECTION AND LAYOUT STRUCTURE THEREOF

(71) Applicant: CSMC TECHNOLOGIES FAB2 CO., LTD., Jiangsu (CN)

(72) Inventor: Guangyang Wang, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 16/329,665

(22) PCT Filed: Aug. 29, 2017

(86) PCT No.: PCT/CN2017/099380
§ 371 (c)(1),
(2) Date: Feb. 28, 2019

(87) PCT Pub. No.: WO2018/041080
PCT Pub. Date: Mar. 8, 2018

(65) Prior Publication Data
US 2019/0198494 A1 Jun. 27, 2019

(30) Foreign Application Priority Data
Aug. 29, 2016 (CN) .......................... 201610749272.0

(51) Int. Cl.
*H01L 27/02* (2006.01)
*H01L 23/528* (2006.01)
(Continued)

(52) U.S. Cl.
CPC ........ *H01L 27/0274* (2013.01); *H01L 23/528* (2013.01); *H01L 27/0277* (2013.01); *H01L 23/60* (2013.01); *H02H 9/00* (2013.01)

(58) Field of Classification Search
CPC ............ H01L 27/0274; H01L 27/0248; H01L 27/0251; H01L 27/0266; H01L 23/60; H01L 23/528; H02H 9/00
See application file for complete search history.

(56) References Cited

U.S. PATENT DOCUMENTS

2002/0149059 A1* 10/2002 Ker .................... H01L 27/0277
257/355
2016/0218040 A1* 7/2016 Maekawa ......... H01L 29/66477

FOREIGN PATENT DOCUMENTS

CN 201213133 Y 3/2009
CN 101834182 A 9/2010
(Continued)

OTHER PUBLICATIONS

International Search Report issued for International Patent Application No. PCT/CN2017/099380, dated Dec. 5, 2017, 5 pages including English translation.

*Primary Examiner* — Tucker J Wright
(74) *Attorney, Agent, or Firm* — Hamre, Schumann, Mueller & Larson, P.C (57) ABSTRACT

A semiconductor device for enhancing electrostatic discharge (ESD) protection and a layout structure thereof are provided. An ESD protection device and a protected device (300) with a small feature linewidth are located on the same well region. The device (300) with the small feature linewidth is located at a middle portion. The ESD protection device is disposed at both sides of the device (300) with the small feature linewidth.

16 Claims, 4 Drawing Sheets

(51) Int. Cl.
*H01L 23/60* (2006.01)
*H02H 9/00* (2006.01)

(56) References Cited

FOREIGN PATENT DOCUMENTS

| | | |
|---|---|---|
| CN | 102054840 A | 5/2011 |
| CN | 205319155 U | 6/2016 |

\* cited by examiner

SEMICONDUCTOR DEVICE FOR ENHANCING ELECTROSTATIC DISCHARGE PROTECTION AND LAYOUT STRUCTURE THEREOF

TECHNICAL FIELD

The present application relates to semiconductor design and fabrication process, and more particularly to a layout structure for enhancing electrostatic discharge protection.

BACKGROUND

The electrostatic discharge (ESD) is a general natural phenomenon in our lives. However, a large current generated in a short period during electrostatic discharge can cause fatal damage to integrated circuit, which is an important problem causing failure in integrated circuit production and application. For example, for the electrostatic discharge phenomena occurring on the human body, it usually occurs within a few hundred nanoseconds, and the maximum peak current may reach several amperes (A), and the time for generating the electrostatic discharge is shorter and the current is larger in other modes. Such large current passes through the integrated circuit in a short period of time, the generated power consumption can seriously exceed the maximum value that the integrated circuit can be withstood, thereby causing serious physical damage to the integrated circuit and finally causing the failure thereof.

In recent, in terms of circuits, it is mainly to enhance the electrostatic discharge withstand capability of the integrated circuit itself, for example, an additional electrostatic protection device or circuit is added, so as to prevent the internal circuit of the integrated circuit from damaging by the electrostatic discharge.

SUMMARY

According to various embodiments of the present application, a layout structure for enhancing electrostatic discharge protection is provided.

A layout structure for enhancing electrostatic discharge protection, includes: an electrostatic discharge protection device; and a device with small feature linewidth being located on the same well region as the electrostatic discharge protection device, where the device with small feature linewidth is located at a middle portion, and the electrostatic discharge protection device is disposed on both sides of the device with small feature linewidth.

A layout structure of a semiconductor device for enhancing electrostatic discharge protection is further provided, and the semiconductor device includes: an electrostatic discharge protection device; and a device with small feature linewidth being located on the same well region as the electrostatic discharge protection device, where the device with small feature linewidth is located at a middle portion, and the electrostatic discharge protection device is disposed on both sides of the device with small feature linewidth;

the layout structure includes:

a plurality of gate polysilicon including a gate of the electrostatic discharge protection device and a gate of the device with small feature linewidth, where each gate polysilicon has a long strip structure, and respective gate polysilicon are arranged in lateral direction at intervals, and the width direction of the gate polysilicon is the lateral direction;

a plurality of N type doping regions disposing between adjacent gate polysilicon; acting as N type source regions of the electrostatic discharge protection device and N type drain regions of the electrostatic discharge protection device arranged in lateral direction at intervals;

a metal layer comprising: a first metal layer forming as interdigitated structure, and being used for connecting the N type source region of the electrostatic discharge protection device with the N type source region of the device with small feature linewidth; and a second metal layer forming as interdigitated structure, and being used for connecting the N type drain region of the electrostatic discharge protection device with N type drain region of the device with small feature linewidth.

The details of one or more embodiments of the present invention are set forth in the accompanying drawings and description below. Other features, objects, and advantages of the present invention will be apparent from the description, drawings and claims.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

In the following description, numerous specific details are set forth in order to provide a more thorough understanding for the present disclosure. However, it will be apparent to those persons skilled in the art that the present disclosure can be implemented without one or more of these details. In other instances, some technical features well known in the art have not been described in order to avoid confusion with the present invention.

It should be understood that the disclosure can be implemented in various forms and should not be explained to be limited to the embodiments set forth herein. In the contrary, these embodiments are provided so that the disclosure will be thorough and complete, and the scope of protection of the present disclosure will be delivered to those persons skilled in the art completely. In the accompany drawings, for the clarity, the size and relative dimensions of the layers and regions may be exaggerated. The same reference numbers indicate the same elements throughout.

It should be understood that when an element or layer is referred to as "on", "adjacent to", "connected to", or "coupled to" another element or layer, it can be referred to that the element or layer is directly on another element or layer, the element or layer is adjacent to, connected to, or coupled to another element or layer directly or by other intermediate element or layer. In the contrary, when an element or layer is referred to as "directly on", "directly adjacent to", "directly connected to", or "directly coupled to" another element or layer, there is no intermediate element or layer. It should be understood that the terms "first", "second", "third" and so on can be used to describe respective elements, components, regions, layers, and/or portions, however they should not be limited by the terms. These terms are merely used to distinguish one of components, regions, layers, and/or portions from another component, region, layer, and/or portion. Therefore, a first element, first component, first region, first layer, or first portion discussed below can be referred to as a second element, second component, second region, second layer, or second portion without departing from the teachings of the present disclosure.

The spatial relationship terms such as "under", "below", "lower", "following", "on", "above", "upper", and so on herein can be used to describe the relationship of one element or feature to the other elements or features shown in the figures for convenience of description. It should be understood that the spatially relative terms are intended to encompass different orientations of the device in use and operation in addition to the orientation shown in accompany drawings. For example, if a device is reversed in the accompany drawings, the description for device or feature that the device is under the other devices or below the other devices means that the device is on the other devices or above the other devices. Therefore, the exemplary terms "under" and "below" can include both the "under" and "below" or "on" and "above". The device can be otherwise oriented (being rotated 90 degrees or other orientation) and the spatial description terms used herein should be described accordingly.

The purpose of using terms herein is merely for describing the specific embodiments and is not for limiting the present disclosure. The singular forms "a", "an", "the" are also intended to include the plural form, unless the context clearly indicates the otherwise forms when using. The terms "include" and/or "comprise", when used in the specification, is used to determine the presence of the features, integers, steps, operations, elements, and/or components, but it should not be excluded existence or addition of one or more other features, integers, steps, operations, elements, components, and/or groups. The term "and/or" used herein includes any combinations and all combinations of the relevant listed items when used therefor.

Figure 1:
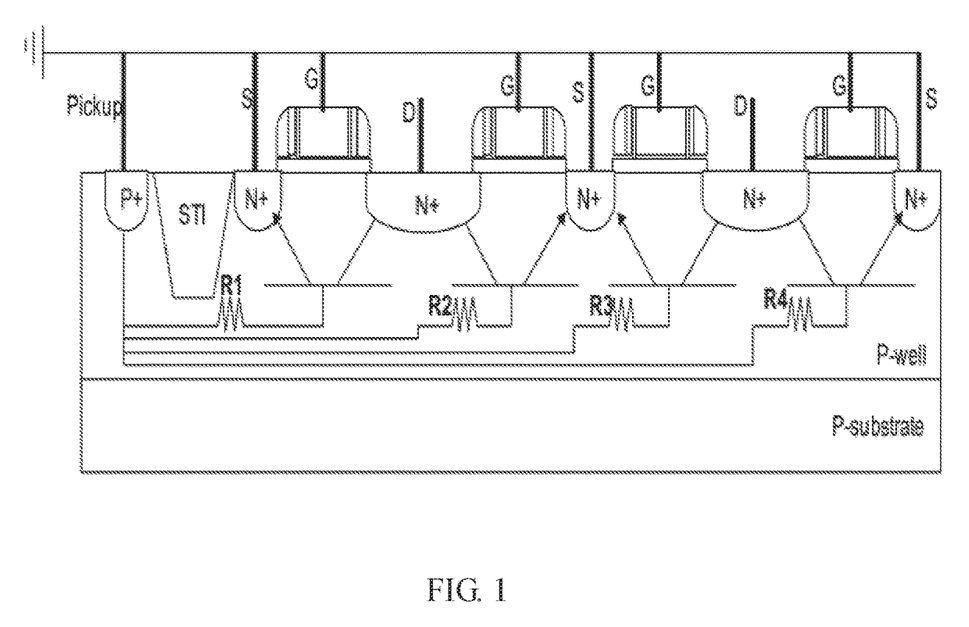
FIG. 1 is a cross-sectional view of a GGNMOS in an ESD protection circuit in an embodiment.

When an integrated circuit (IC) starts to operate, a high energy from the outside is applied to the IC, and an instantaneous electrostatic discharge phenomenon may be generated in the IC. A transient high voltage may be generated inside the IC by the electrostatic discharge, which can cause the breakdown of the gate oxide and malfunction of the IC. An electrostatic discharge protection circuit commonly used in the prior art is a GGNMOS (grounded-gate NMOS). As the feature size of a MOS device continues to decrease, the more thickness of gate oxide is decrease, the more impact of electrostatic discharge is sensitive. As shown in FIG. 1, in a NMOS region of the GGNMOS, the source S and the gate G are grounded, the pickup region is also grounded, and the resistances formed between the NPN junction formed between each pair of the source S and the drain D and the pickup area are R1, R2, R3 and R4, respectively, and the NPN junction formed between each pair of the source S and the drain D is referred to as finger, each finger in the GGNMOS simultaneously turns on the electrostatic discharge protection when the electrostatic discharge occurs.

In a clock circuit application, the width of the MOS should not be too long, otherwise the frequency of the clock circuit will be affected. In the existing protection scheme for the electrostatic discharge circuit, a device with small feature linewidth is commonly used as a port circuit, such as a redundant MOS, and then a GGNMOS or other electrostatic discharge protection circuit with a similar working principle of the GGNMOS is connected in parallel. The linewidth of the device with small feature linewidth is typically less than 100 microns, and the specific linewidth thereof is determined depending on the specific requirement of the design of the layout.

Figure 2:
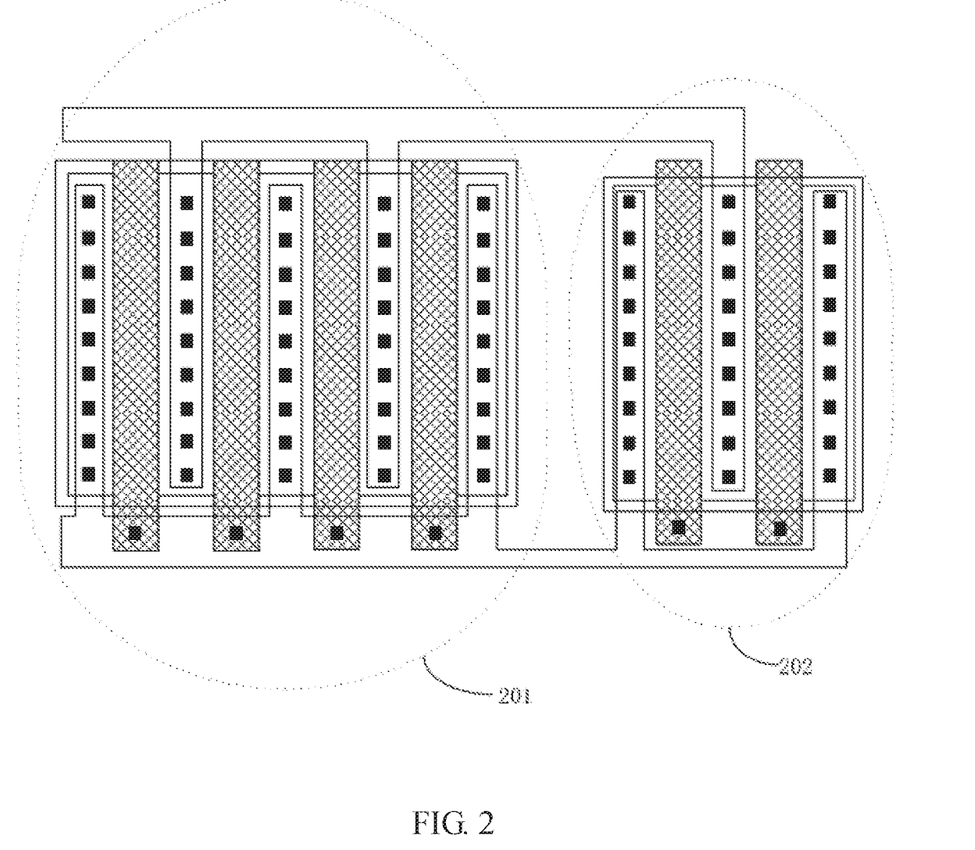
FIG. 2 is a schematic diagram of a layout structure corresponding to the ESD protection circuit of FIG. 1.

Due to the complicated structure of the GGNMOS or other electrostatic discharge protection circuit with a similar working principle of the GGNMOS, the occupied layout area thereof is large. Therefore, as shown in FIG. 2, in a layout structure corresponding to the existing electrostatic discharge circuit protection scheme, the electrostatic discharge protection device 201 and the device 202 with small feature linewidth are located on different well regions, respectively. The portion between the electrostatic discharge protection device 201 and the device 202 with small feature linewidth is provided with an isolation structure such as field oxide or shallow trench isolation, and the isolation structure and other devices can also exist.

Since the gate of the device 202 with small feature linewidth is connected to the control end of the internal circuit, the trigger voltage is low, the energy generated by the electrostatic discharge is substantially discharged via the device with small feature linewidth when the electrostatic discharge occurs. Since the electrostatic discharge protection device and the device with small feature linewidth are located on different well regions, respectively, and both of them are blocked by the isolation structure, the generated substrate current cannot effectively trigger the electrostatic discharge protection device, thereby causing the device with small feature linewidth invalid at very low electrostatic discharge level, and that the electrostatic discharge protection device in parallel with the device with small feature linewidth cannot play a protective role.

Figure 3:
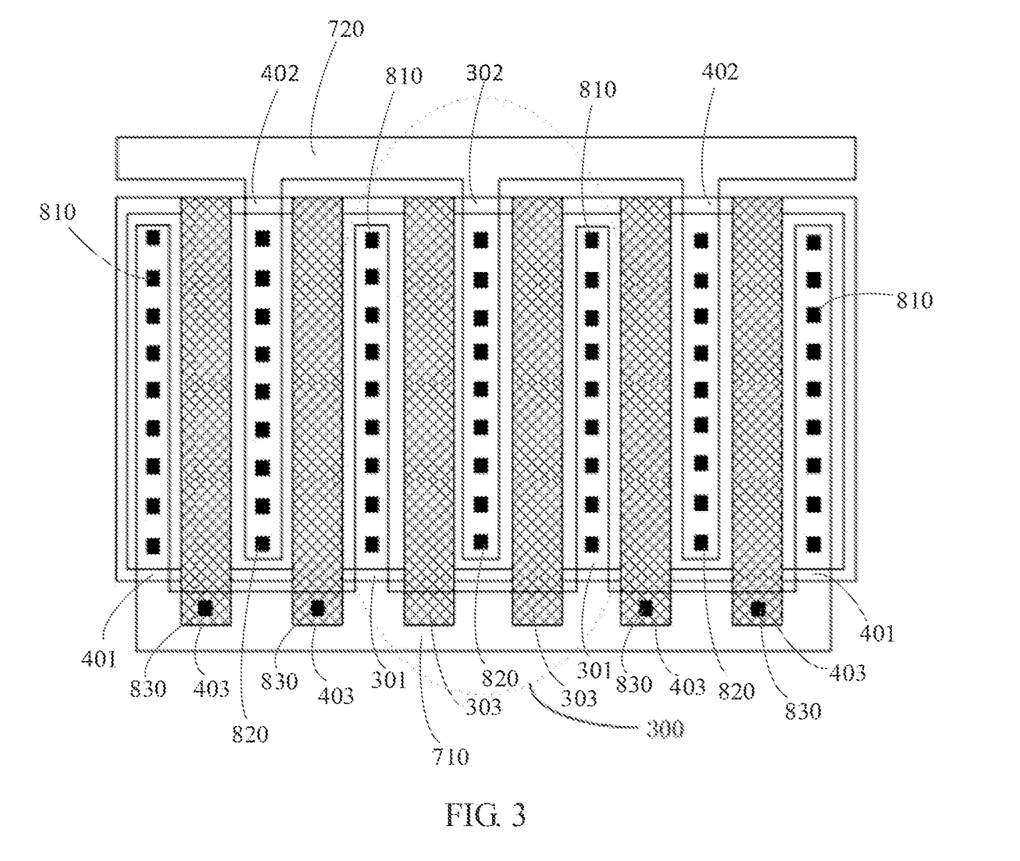
FIG. 3 is a schematic diagram of a layout structure corresponding to the ESD protection circuit in an embodiment.

In order to solve the above problem, a semiconductor device for enhancing the electrostatic discharge protection is provided, as shown in FIG. 3, in an embodiment, an electrostatic discharge protection device and a protected device 300 with small feature linewidth are located on the same well region. The device 300 with small feature linewidth is located at the middle portion, and the electrostatic discharge protection device is disposed on both sides of the device 300 with small feature linewidth, thereby saving the layout area and enhancing the electrostatic discharge protection for the device 300 with small feature linewidth.

Taking the redundant MOS of the device 300 with small feature linewidth as an example, the electrostatic discharge protection device and the protected redundant MOS are located on the same well region instead of being located on different well regions, respectively, thereby saving the layout area by eliminating a part of isolation structure. The protected redundant MOS is located in the middle portion, and the electrostatic discharge protection device such as GGNMOS is disposed on both sides of the protected redundant MOS.

Since the electrostatic discharge protection device and the protected device 300 with small feature linewidth are located on the same well region, the layout designer can adjust the sizes and ratios of the electrostatic discharge protection device and the protected device 300 with small feature linewidth by modifying the pattern size of the lithography mask according to actual requirement, this operation is relatively flexible and there is no need to redesign the layout.

The semiconductor device further includes an active region, the redundant MOS, the GGNMOS, and the well region are disposed in the active region, and the redundant MOS is located in the middle portion of the active region, and the GGNMOS is disposed on the both sides in lateral direction (that is, in the left and right directions in FIG. 4) of the redundant MOS in the same active region. The well region is P well, the N type doping region SN of the GGNMOS and the N type doping region SN of the redundant MOS are disposed in the P well (the N type doping region of the GGNMOS and the N type doping region of the redundant MOS are both represented by "SN" in FIG. 4).

Figure 4:
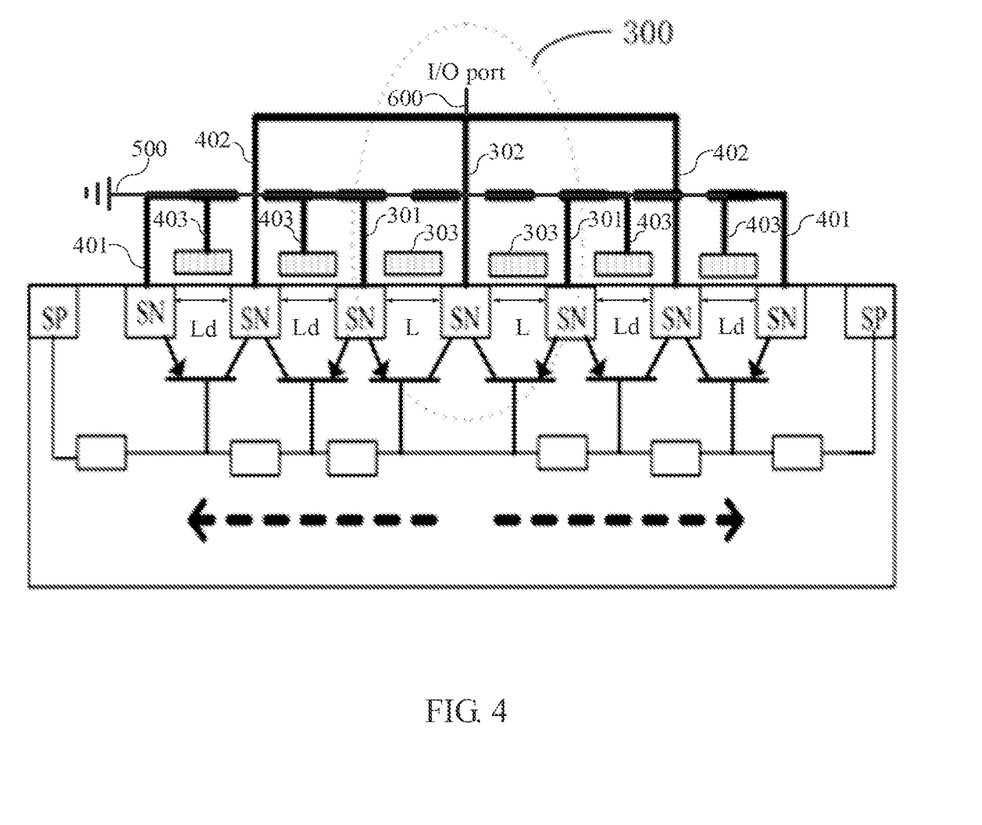
FIG. 4 is a schematic view showing a flow direction of discharge current when an electrostatic discharge protection test is performed on the layout structure of FIG. 3 in an embodiment.

Referring to FIG. 4, the semiconductor device further includes a P type doping region SP leading out as a substrate, and the P type doping region SP is disposed outmost the GGNMOS in the active region, that is, the semiconductor device includes a P type doping region SP disposing on the left side of the left GGNMOS and a P type doping region SP disposing on the right side of the right GGNMOS.

In an embodiment, the P type doping region is disposed in the P well, and the doping concentration of the P type doping region is greater than the doping concentration of the P well.

As shown in FIG. 4, when an electrostatic discharge protection test is performed on the layout structure shown in FIG. 3, since the protected device 300 with small feature linewidth (corresponding to the cross-sectional structure of the protected device 300 with small feature linewidth in FIG. 3) has a low trigger voltage, power generated by the electrostatic discharge is firstly released through the drain end of the device 300 with small feature linewidth. At this time, the gate of the device 300 with small feature linewidth is in a turn-off state which does not function under the normal operation, since there is no isolation therebetween due to an isolation structure, the subsequently generated substrate current can quickly trigger the parasitic bipolar transistor (BJT) in the electrostatic discharge protection device, thereby enhancing the electrostatic discharge protection.

The device 300 with small feature linewidth is located at the middle portion, and the electrostatic discharge protection device is disposed on both sides of the device 300 with small feature linewidth, so that the components constituting the electrostatic discharge protection device are mirror-symmetrically distributed around the device 300 with small feature linewidth, thereby shortening the triggering time of the substrate current for the components constituting the electrostatic discharge protection device.

In an embodiment, the channel length of the device with small feature linewidth is greater than the channel length of the electrostatic discharge protection device. By adjusting the channel length L of the protected device 300 with small feature linewidth and the channel length Ld of the electrostatic discharge protection device to make L larger than Ld, the increase of the channel resistance can promote the triggering voltage of the protected device 300 with small feature linewidth and improve the conduction capability of the drain end, so that the electrostatic discharge protection is further enhanced. In an embodiment, the protected device 300 with small feature linewidth and the electrostatic discharge protection device are double gates structure, a source is shared between the gates, the source is doped with N+ type impurity, and the N+ type impurity includes phosphorus, nitrogen, arsenic, antimony, bismuth, and so on. In FIG. 4, the "SN" represents a N type doping region which dopes with N+ type impurity, the "SP" represents a pick-up region which dopes with P+ type impurity, and the P+ type impurity includes boron, aluminum, gallium, indium, thallium, and so on.

In an embodiment, a distance between the drain end and the gate of the device 300 with small feature linewidth is generally greater than a distance between the drain end and the gate of the electrostatic discharge protection device.

In an embodiment, the gate and the source of the electrostatic discharge protection device are connected together and are connected to the ground end 500, the source of the protected device 300 with small feature linewidth is connected to the ground end 500, and the gate of the protected device 300 with small feature linewidth is connected to the control end of the internal circuit.

In an embodiment, the drains of the electrostatic discharge protection device and the protected device 300 with small feature linewidth are both connected to an I/O port 600.

According to the afore-described semiconductor device for enhancing electrostatic discharge protection, the electrostatic discharge protection device is disposed on both sides of the device 300 with small feature linewidth, and the electrostatic discharged of the device 300 with small feature linewidth can be effectively protected, meanwhile, the cost and the design difficulty for the circuit are reduced, and the flexibility of circuit design is improved.

A layout structure of a semiconductor device for enhancing electrostatic discharge protection is further provided, the semiconductor device can be the semiconductor device for enhancing electrostatic discharge protection in any one of the forgoing embodiments; as shown in FIG. 3, the layout structure includes a plurality of gate polysilicon, a plurality of N type doping regions, and a metal layer.

Each of the gate polysilicon has a long strip structure, and includes a gate 403 of the electrostatic discharge protection device and a gate 303 of the device with small feature linewidth, and respective gate polysilicon are arranged at intervals in the lateral direction (that is, the channel length direction of the electrostatic discharge protection device or the channel length direction of the device with small feature linewidth), the width direction of the gate polysilicon of the long strip structure is also the channel length direction of the electrostatic discharge protection device or the channel length direction of the device with small feature linewidth. The channel length direction of the device with small feature linewidth is the current direction between the source and the drain of the device with small feature linewidth, and the channel length direction of the electrostatic discharge protection device is the current direction between the source and the drain of the electrostatic discharge protection device.

The device 300 with small feature linewidth can be a redundant MOS, and the electrostatic discharge protection device can be a GGNMOS.

The N type doping region is disposed between adjacent gate polysilicon; the N type doping region includes a N type doping region acting as a N type source region 401 of the electrostatic discharge protection device, a N type doping region acting as a N type drain region 402 of the electrostatic discharge protection device, a N type doping region acting as a N type source region 301 of the device with small feature linewidth, and a N type doping region acting as a N type drain region 302 of the device with small feature linewidth. The N type doping region acting as the N type source region 401 of the electrostatic discharge protection device and the N type doping region acting as the N type drain region 402 of the electrostatic discharge protection device are arranged in lateral direction at intervals. The N type doping region acting as the N type source region 301 of the device with small feature linewidth and the N type doping region acting as the N type drain region 302 of the device with small feature linewidth are laterally distributed at intervals.

The metal layer includes a first metal layer 710 and a second metal layer 720. The first metal layer 710 and the second metal layer 720 are both interdigitated structures. The first metal layer 710 is used for connecting the N type source region 401 of the electrostatic discharge protection device with the N type source region 301 of the device 300 with small feature linewidth, and the second metal layer 720 is used for connecting the N type drain region 402 of the electrostatic discharge protection device with the N type drain region 302 of the device 300 with small feature linewidth.

In an embodiment, the layout structure further includes a contact hole 810, 820, 830. The contact hole 810, 820, 830 includes a contact hole 810, 820 for leading out respective N type doping region and a contact hole 830 for leading out the gate polysilicon of respective electrostatic discharge protection device. The N type source region 401 of the electrostatic discharge protection device and the N type source region 301 of the device 300 with small feature linewidth are electrically connected to the first metal layer 710 via corresponding contact hole 810. The N type drain region 402 of the electrostatic discharge protection device and the N type drain region 302 of the device 300 with small feature linewidth are electrically connected to the second metal layer 720 via corresponding contact hole 820. The gate polysilicon of the electrostatic discharge protection device is electrically connected to the first metal layer 710 via corresponding contact hole 830.

Since the electrostatic discharge protection device and the protected device 300 with small feature linewidth are located on the same well region, the electrostatic discharge protection device and the protected device 300 with small feature linewidth utilize similar layout structure, and the difference therebetween is merely the contact hole/metal layer, the layout designer can adjust the sizes and ratios of the electrostatic discharge protection device and the protected device 300 with small feature linewidth by modifying the pattern size of the lithography mask of the metal layer/contact hole according to actual requirement, this operation is relatively flexible and there is no need to redesign the layout The technical features of the above embodiments can be arbitrarily combined. For the sake of brevity of description, all possible combinations of the technical features in the above embodiments are not described. However, as long as there is no collision in the combination of these technical features, it should be considered as the scope described in this specification.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

What is claimed is:

1. A semiconductor device for enhancing electrostatic discharge protection, comprising:
a plurality of electrostatic discharge protection devices; and
a device with small feature linewidth, located on a same well region as the plurality of electrostatic discharge protection devices, the device with small feature linewidth being located between two of the plurality of electrostatic discharge protection devices, the device with small feature linewidth being a protected device, wherein, during electrostatic discharge protection, a gate of the device with small feature linewidth is in a turn-off state.

2. The semiconductor device of claim 1, wherein, the device with small feature linewidth is a redundant MOS, and each of the plurality of electrostatic discharge protection devices is a GGNMOS.

3. The semiconductor device of claim 1, wherein, sizes and ratios of the plurality of electrostatic discharge protection devices and the device with small feature linewidth are adjusted by modifying pattern size of a lithography mask.

4. The semiconductor device of claim 1, wherein, channel length of the device with small feature linewidth is greater than channel length of any of the plurality of electrostatic discharge protection devices.

5. The semiconductor device of claim 1, wherein, the device with small feature linewidth and each of the plurality of electrostatic discharge protection devices are each double gates structures, and a source is shared between gates.

6. The semiconductor device of claim 5, wherein, the source is doped with N+ type impurity, and the N+ type impurity is at least one of phosphorus, nitrogen, arsenic, antimony, and bismuth.

7. The semiconductor device of claim 1, wherein, a gate and a source of each of the plurality of electrostatic discharge protection devices are connected together and are connected to a ground end.

8. The semiconductor device of claim 1, wherein, a source of the device with small feature linewidth is connected to a ground end.

9. The semiconductor device of claim 1, wherein, drains of each of the plurality of electrostatic discharge protection devices and the device with small feature linewidth are connected to an I/O port.

10. The semiconductor device of claim 1, wherein, linewidth of the device with small feature linewidth is less than 100 microns.

11. The semiconductor device of claim 2, further comprising: an active region, wherein the redundant MOS, the GGNMOS, and the well region are disposed in the active region; the well region is P well, a N type doping region of the GGNMOS and a N type doping region of the redundant MOS are disposed in the P well.

12. The semiconductor device of claim 11, further comprising: a P type doping region leading out as a substrate, and the P type doping region being disposed outmost the GGNMOS on both sides.

13. The semiconductor device of claim 12, wherein, the P type doping region is disposed in the P well, and doping concentration of the P type doping region is greater than doping concentration of the P well.

14. A layout structure of a semiconductor device for enhancing electrostatic discharge protection, and the semiconductor device comprising:
a plurality of electrostatic discharge protection devices; and
a device with small feature linewidth located on a same well region as the electrostatic discharge protection device, the device with small feature linewidth being located at a middle portion, and two of the plurality of electrostatic discharge protection devices being disposed on both sides of the device with small feature linewidth, the device with small feature linewidth being a protected device; and the layout structure comprising:
a plurality of gate polysilicon including gates of the plurality of electrostatic discharge protection devices and a gate of the device with small feature linewidth, each gate polysilicon having a long strip structure, and respective gate polysilicon being arranged in lateral direction at intervals, wherein width direction of the gate polysilicon is the lateral direction;
a plurality of N type doping regions disposed between adjacent gate polysilicon, acting as an N type source region of the electrostatic discharge protection device and a N type drain region of the electrostatic discharge protection device arranged in lateral direction at intervals;
a metal layer comprising:
  a first metal layer forming as interdigitated structure, and being configured to connect the N type source region of the electrostatic discharge protection device with a N type source region of the device with small feature linewidth; and
  a second metal layer forming as interdigitated structure, and being configured to connect the N type drain region of the electrostatic discharge protection device with N type drain region of the device with small feature linewidth,
wherein, during electrostatic discharge protection, a gate of the device with small feature linewidth is in a turn-off state.

15. The layout structure of claim 14, further comprising:
contact holes comprising a contact hole for leading out respective N type doping region and a contact hole for leading out the gate polysilicon of respective electrostatic discharge protection device; wherein the N type source region of the electrostatic discharge protection device and the N type source region of the device with small feature linewidth are electrically connected to the first metal layer via corresponding contact hole, the N type drain region of the electrostatic discharge protection device and the N type drain region of the device with small feature linewidth are electrically connected to the second metal layer via corresponding contact hole, and the gate polysilicon of respective electrostatic discharge protection device is electrically connected to the first metal layer via corresponding contact hole.

16. The layout structure of claim 14, wherein, the device with small feature linewidth is a redundant MOS, and each of the plurality of electrostatic discharge protection devices is a GGNMOS.

* * * * *